(12) United States Patent
Wu et al.

(10) Patent No.: US 6,557,117 B1
(45) Date of Patent: Apr. 29, 2003

(54) BUILT-IN SELF TEST FOR PLL MODULE WITH ON-CHIP LOOP FILTER

(75) Inventors: Scarlett Wu, Hillsborough, CA (US); Darren Neuman, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/337,953

(22) Filed: Jun. 22, 1999

Related U.S. Application Data
(60) Provisional application No. 60/090,903, filed on Jun. 25, 1998.

(51) Int. Cl.[7] ................................................ H04B 1/74
(52) U.S. Cl. ........................ 714/30; 714/700; 714/733; 375/226; 375/376; 324/76.48; 324/76.53
(58) Field of Search ......................... 714/30, 700, 733; 375/376, 226; 324/76.53, 76.48

(56) References Cited

U.S. PATENT DOCUMENTS

| | | | | |
|---|---|---|---|---|
| 5,125,107 A | * | 6/1992 | Herold et al. ............. | 455/226.1 |
| 5,381,085 A | * | 1/1995 | Fischer ..................... | 324/76.48 |
| 5,663,991 A | * | 9/1997 | Kelkar et al. ............... | 375/376 |
| 5,729,151 A | * | 3/1998 | Zoerner et al. ............. | 324/763 |
| 5,889,435 A | * | 3/1999 | Smith et al. ................ | 331/1 A |
| 6,330,681 B1 | * | 12/2001 | Cote et al. .................. | 713/322 |

OTHER PUBLICATIONS

Press Release—LogicVision and Credence Team to Develop Tester Support for Embedded ATE; Oct. 20, 1998, (3 pgs)—Author(s)—LogicVision Credence Systems Corp.

Press Release—Logicvision Introduces Comprehensive Solution for Core–Based System–On–Chip Testing; Oct. 20, 1998, (3 pgs)—Author(s)—LogicVision Credence Systems Corp.

Advertisement—pl1BIST The Chip Level Solution "At–Speed Test of Phase–Locked Loops". (2 pgs)—Author(s)—LogicVision The Embedded ATE Company.

* cited by examiner

*Primary Examiner*—Robert Beausoliel
*Assistant Examiner*—Michael Maskulinski
(74) *Attorney, Agent, or Firm*—Christopher P. Maiorana, PC

(57) ABSTRACT

An on-chip built-in self test apparatus for a phase locked loop module that resides on an integrated circuit, receives a reference clock signal and provides an output clock signal. The apparatus generally comprises a finite state machine and testing circuitry. The finite state machine may be for (i) receiving the reference clock signal and for (ii) producing testing signals for the phase locked loop module. The testing circuitry may be coupled to the finite state machine for (i) receiving the output clock signal, (ii) determining whether the characteristics of the output clock signal meet a predetermined criteria for open and close loop phase locked loop module operation, and (iii) outputting a test signal that indicates proper phase locked loop module operation if the characteristics of the output clock signal meet the predetermined criteria.

12 Claims, 6 Drawing Sheets

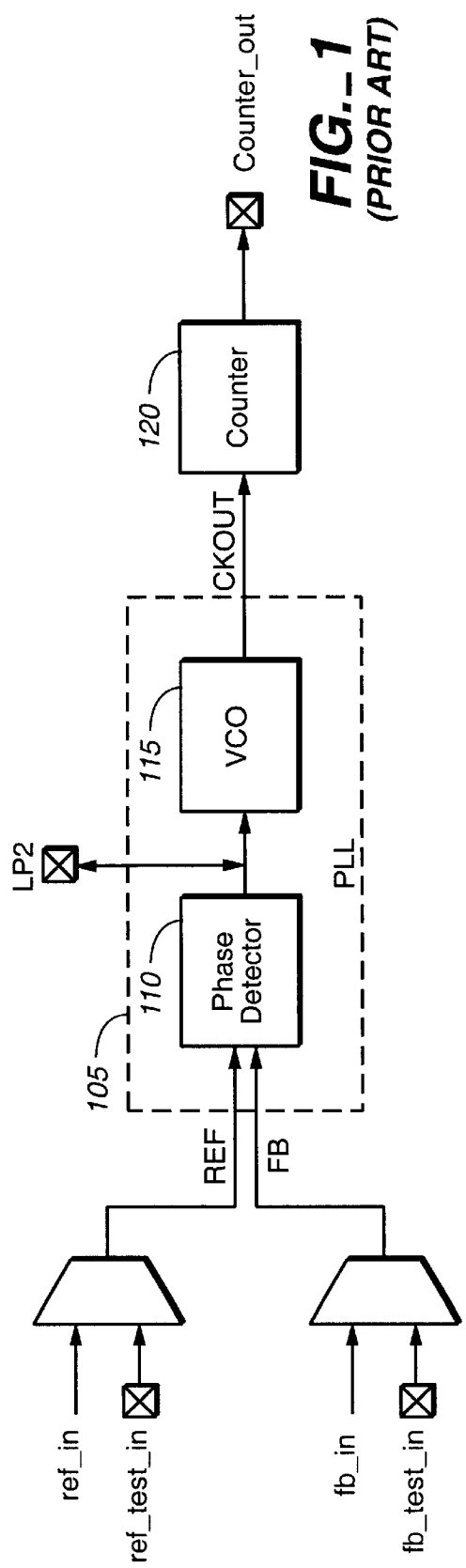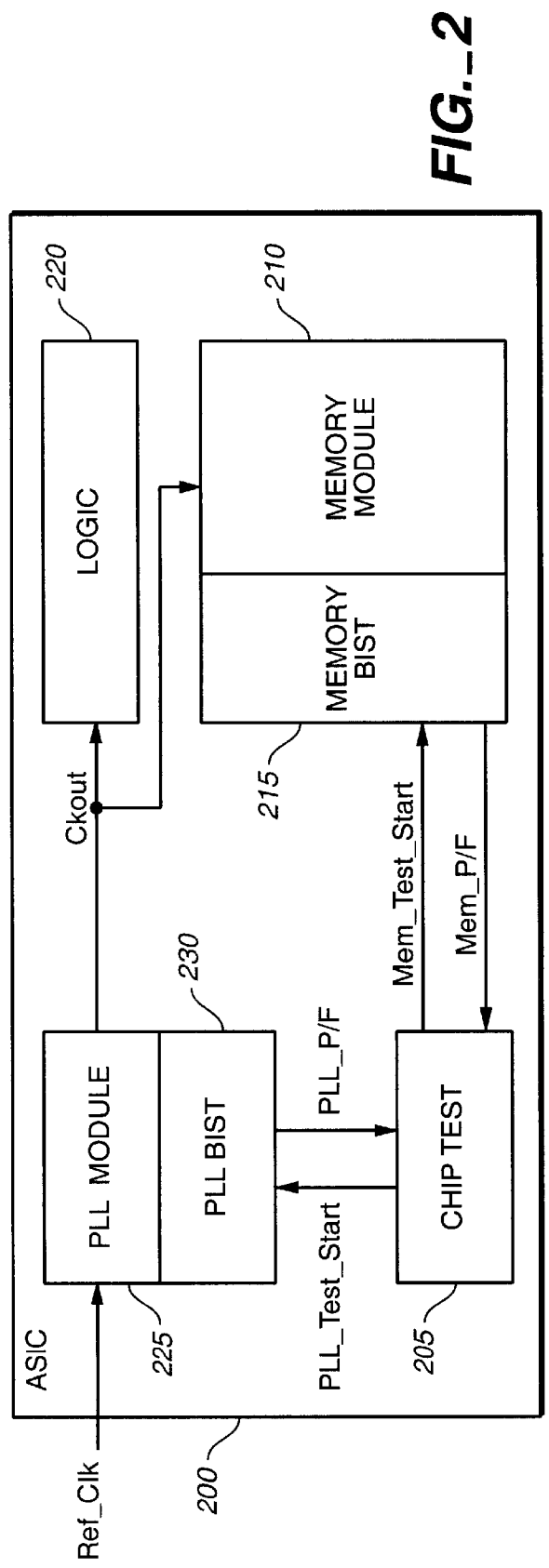

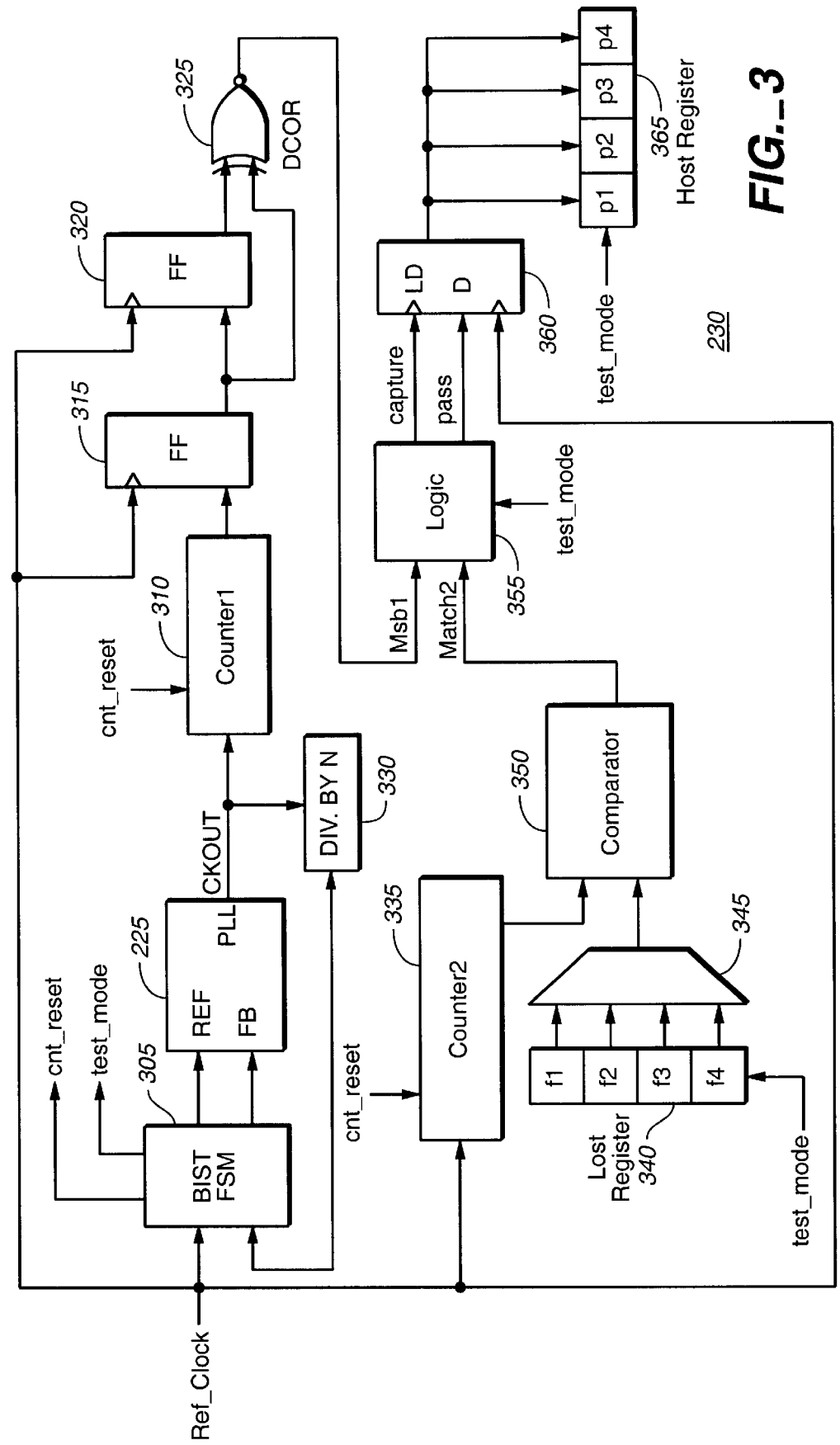
FIG._3

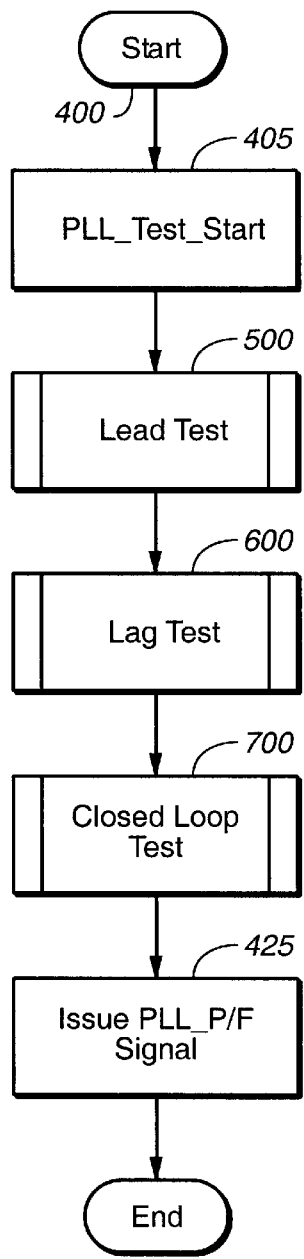
FIG._4
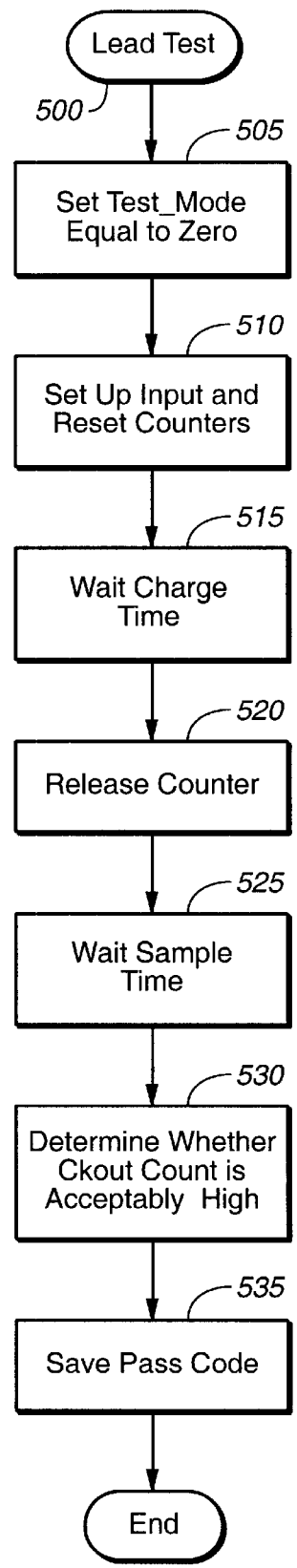
FIG._5

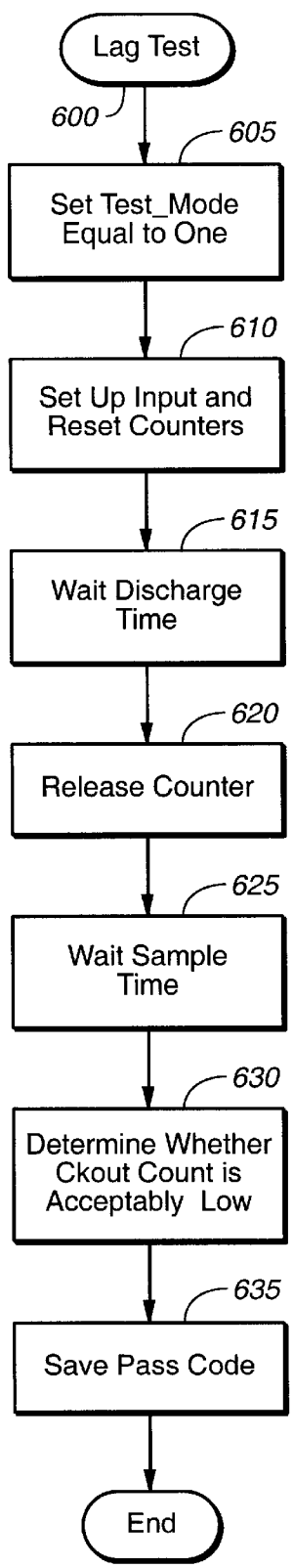
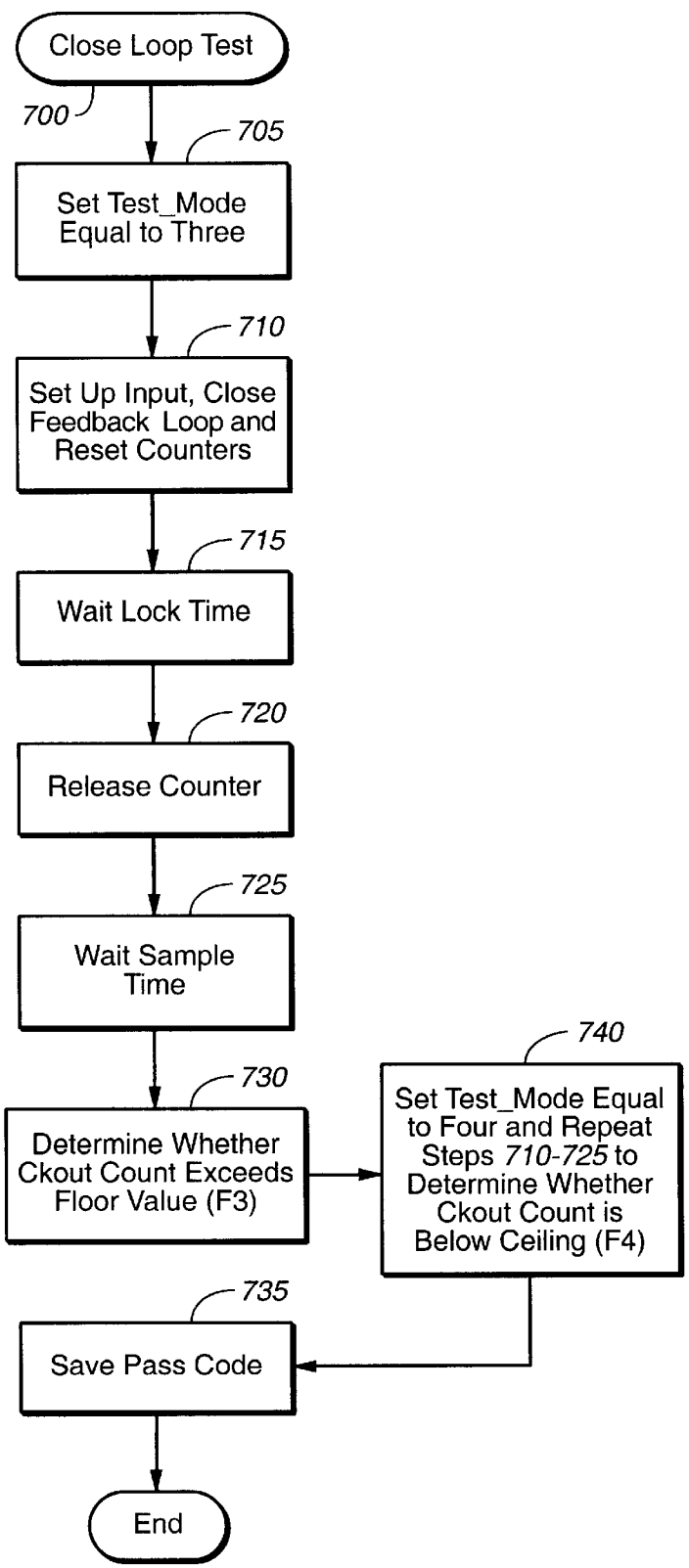
*FIG._6*  *FIG._7*

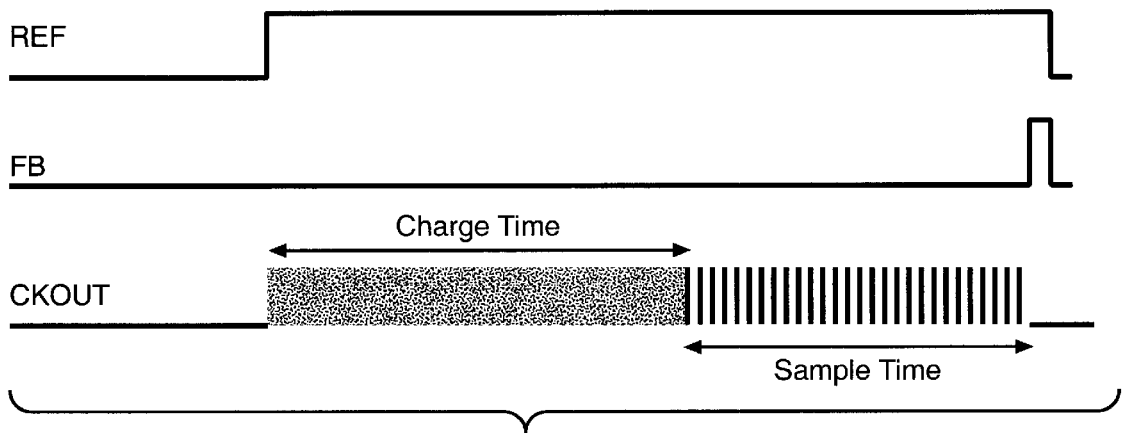
FIG._8
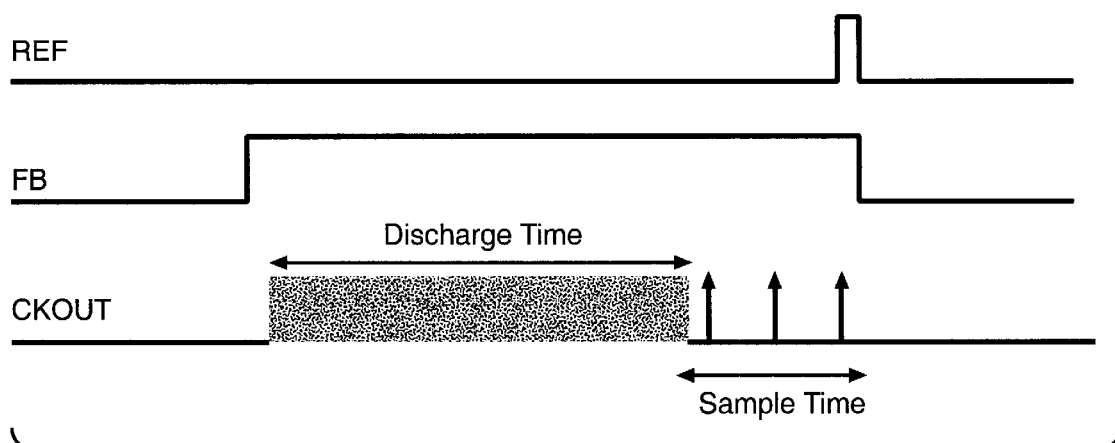
FIG._9
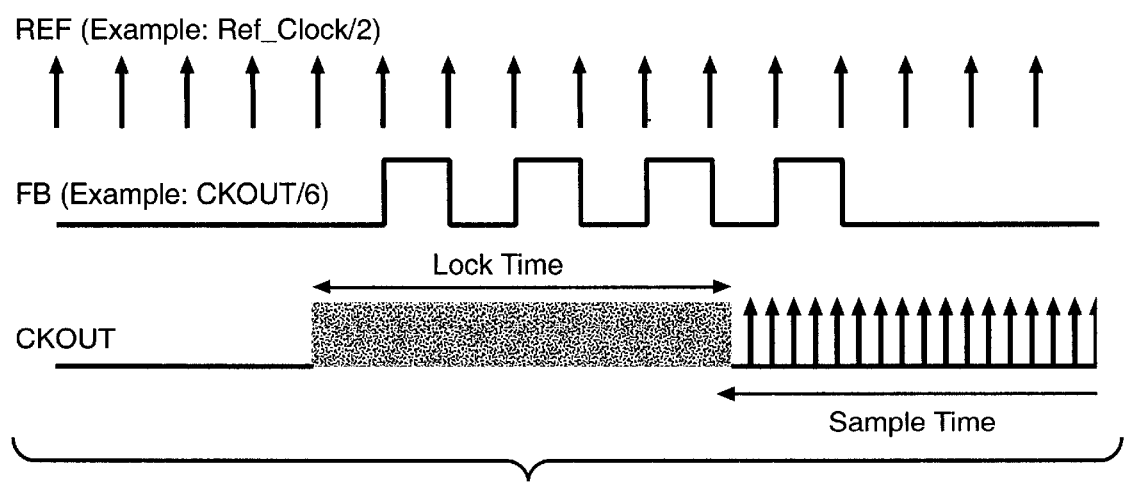
FIG._10

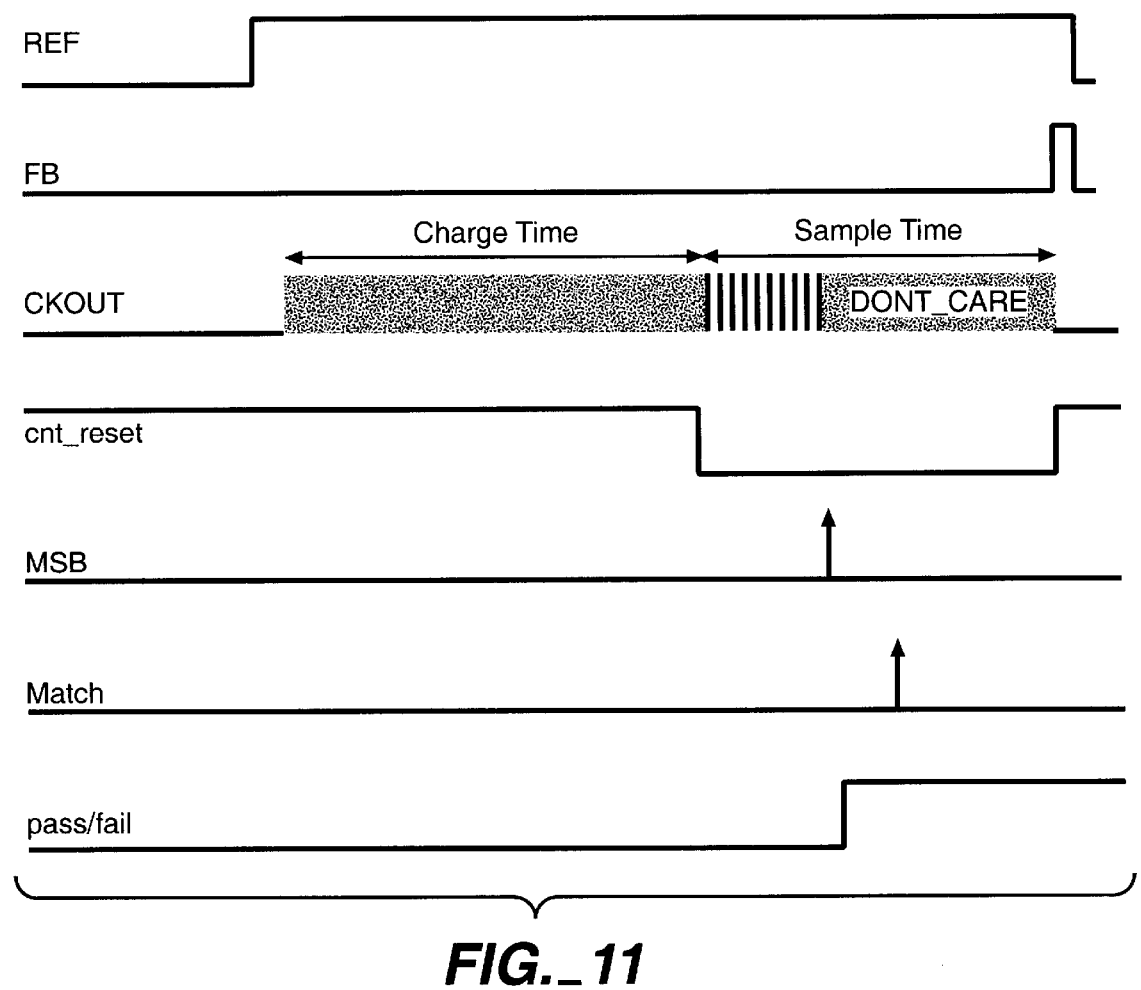
FIG._11

BUILT-IN SELF TEST FOR PLL MODULE WITH ON-CHIP LOOP FILTER

CROSS-REFERENCE TO RELATED APPLICATION

This application claims priority from U.S. Provisional Application No. 60/090,903, filed Jun. 25, 1998 by Scarlett Wu and Darren Neuman, entitled "A BIST ALGORITHM FOR PLL MODULE WITH ON-CHIP LOOP FILTER" which is fully incorporated herein by reference.

FIELD OF THE INVENTION

This application relates generally to integrated circuitry, and more particularly to built in self testing of a phase locked loop module with an on-chip loop filter.

BACKGROUND ART

The on chip integration of a phase locked loop ("PLL") module and its loop filter has become common place in recent years. However, with the traditional PLL test methods, PLL test vector generation has become a time consuming backend task for many designers as PLLs are designed into more complicated configurations and as technology migrates. A built in self time (BIST) algorithm can dramatically shorten the time that designers spend on test vector generation.

The traditional test,methods have always been developed for PLL modules that have an off-chip loop filters. The following diagram of FIG. 1 shows the major components for traditional PLL test. The test methodology takes advantage of the fact that the loop filter connection pin can be externally controlled as well as observed. As shown in FIG. 1, this pin LP2 is used as a break point between the two (2) major PLL 105 components, which are the phase detector 110 and the VCO 115. Each component is tested separately. No close loop test is done.

The traditional PLL test methods require the designer to build hardware around the PLL 105 to enable external access to PLL input and to sample the PLL output frequency. The designer is also required to manually create external input vectors which step through a pre-determined input sequences. On the output side, the designer has to externally interpret the timing of the counter 120 output to determine whether the test has passed or failed.

The traditional tests methodology is too time consuming because it requires manual generation of external input patterns for each PLL module integrated on chip, making the reusing of these vectors out of the question.

The traditional test methodology also does not provide any close-loop test capability.

If the loop filter is integrated on chip, the loop filter connection is no longer accessible for off-chip use. In order to achieve the same testing goal, which is to test the phase detector and the VCO separately, a new test method is needed.

SUMMARY OF THE INVENTION

The present invention concerns an on-chip built-in self test apparatus for a phase locked loop module that resides on an integrated circuit, receives a reference clock signal and provides an output clock signal. The apparatus generally comprises a finite state machine and testing circuitry. The finite state machine may be for (i) receiving the reference clock signal and (ii) producing testing signals for the phase locked loop module. The testing circuitry may be coupled to the finite state machine for (i) receiving the output clock signal, (ii) determining whether the characteristics of the output clock signal meet a predetermined criteria for open and close loop phase locked loop module operation, and (iii) outputting a test signal that indicates proper phase locked loop module operation if the characteristics of the output clock signal meet the predetermined criteria.

The basis of the new PLL test methodology is to use built-in self test (BIST) instead of manual test. It is intended that all input sequence for PLL test should be generated automatically and all output results should be interpreted internally. At the end of BIST test, only the pass/fail status flags are available to the designer. In addition, the new method also allows sufficient testing in PLL close loop configuration.

BRIEF DESCRIPTION OF THE DRAWINGS

FIG. 1 is a block diagram illustrating conventional phase locked loop module testing.

FIG. 2 is a block diagram illustrating an embodiment of an application specific integrated circuit with PLL BIST circuitry constructed in accordance with the present invention.

FIG. 3 is a block diagram illustrating an embodiment of PLL BIST circuitry constructed in accordance with the present invention.

FIG. 4 is a flow diagram illustrating an embodiment of a method for operating a PLL BIST circuitry in accordance with the present invention.

FIG. 5 is a flow diagram illustrating an embodiment of a method for operating a PLL BIST circuitry to provide a PLL lead test in accordance with the present invention.

FIG. 6 is a flow diagram illustrating an embodiment of a method for operating a PLL BIST circuitry to provide a PLL lag test in accordance with the present invention.

FIG. 7 is a flow diagram illustrating an embodiment of a method for operating a PLL BIST circuitry to provide a PLL close loop test in accordance with the present invention.

FIG. 8 is a timing diagram illustrating exemplary testing signals and output clock signals for a PLL lead test.

FIG. 9 is a timing diagram illustrating exemplary testing signals and output clock signals for a PLL lag test.

FIG. 10 is a timing diagram illustrating exemplary testing signals and output clock signals for a PLL close loop test.

FIG. 11 is a timing diagram illustrating exemplary testing signals, output clock signals, and signals produced by testing circuitry for a PLL lead test.

DETAILED DESCRIPTION OF THE PREFERRED EMBODIMENTS

FIG. 2 is a block diagram of an application specific integrated circuit (ASIC) 200 with a PLL BIST circuitry 230 in accordance with an embodiment of the present invention. The ASIC 200 also includes the following conventional components: chip test stage 205, memory module 210, memory BIST 215, logic stage 220, and PLL module 225. The PLL module 225 receives the reference input clock signal Ref_Clk and outputs an output clock signal Ckout. The PLL BIST circuitry 230 receives a PLL_Test_Start signal from the chip stage 205 and outputs a PLL_P/F pass/fail signal, as described below.

A hardware block diagram of a PLL BIST circuitry 230 is shown in FIG. 3. A BIST finite state machine (FSM) 305 generates appropriate input sequence on the PLL 225 input side (terminals "REF" and "FB"). The FSM 305 instructs the input sequence to step through four (4) distinct test modes, namely, lead test, lag test, close loop high test and close loop low test. The following timing diagrams of FIGS. 8, 9, and 10 shows the input set up and expected output behavior of each test mode.

The output frequency measurement is mainly conducted by two (2) counters 310 and 335 referred to in the diagram of FIG. 3. Counter 310 (i.e., "Counter 1" in FIG. 3) runs off the PLL output clock signal "Ckout" and counter 335 (i.e., "Counter 2") runs off the reference clock signal "Ref_Clock". At the beginning of each test mode, the BIST FSM 305 releases both counters from reset state. The Comparator 350 flags a Match signal "Match 2" as soon as counter 335 counts up to a terminal count value programmed in a host register 340. The Logic block 355 evaluates the arrival time of the Match signal ("Match 2") and the MSB ("Msb1") of counter 310, and based on the particular test mode it is in, it determines the appropriate pass/fail status which is then stored in host register 365. The value of the "test_mode" signal determines the particular test mode that is to be performed.

The terminal count programmed in host registers ($f_1$, $f_2$, $f_3$ and $f_4$) (or 340) corresponds to frequency limitation and the Logic block 355 determines whether this frequency limitation is an upper bound or a lower bound. For example, assume counter 310 is a 10-bit counter, meaning that it takes 512 PLL output clock cycles for the counter MSB to rise. Also assume Ref_clock is running at 27 MHz, and thus two things should be done. First, the terminal count should be programmed to:

$$128 = 512*27 \text{ Mhz}/108 \text{ Mhz}$$

And second, the Logic block should 355 interpret an MSB arriving before Match as a pass. And this is exactly what is done during the evaluation stage of the lead time. FIG. 11 is a timing diagram for a case of lead test passing.

It is noted that the PLL BIST circuitry 230 also includes the following components, as shown in FIG. 3: flip-flop 315 and 320, exclusive OR gate 325, divide-by-n circuit 330, multiplexer 345 and latch 360

FIG. 4 is a flow diagram illustrating an embodiment of a method for operating a PLL BIST circuitry in accordance with the present invention. After the method initiates 400, the chip test stage 205 (FIG. 2) generates 405 a PLL_Test_Start signal to permit the PLL BIST circuit 230 (FIG. 2) to begin the testing of the PLL module 225 (FIG. 2). The various test modes are then performed, including the Lead Test 500, the Lag Test 600, and the Closed Loop Test 700. The Logic block 355 (FIG. 2) will then issue 425 a PLL_P/F Signal having a value depending on the results of the above tests. For example, if all of the above test do not include a failure occurrence, then the PLL_P/F signal will have a high logic value (as illustrated by the pass/fail signal of FIG. 11).

FIG. 5 is a flow diagram illustrating an embodiment of a method for performing a PLL lead test 500 in accordance with the present invention. The test_mode signal (FIG. 3) is set 505 to a value of zero by FSM 305 to indicate the PLL lead test 500 will be performed. In step 510, the input signals from FSM 305 to PLL 225 are set up, and the counters 310 and 335 (FIG. 3) are reset by the reset signal "cnt_reset" in FIG. 3. A charge time occurs 515 to charge up the voltage controlled oscillator of the PLL 225 and increase the Ckout clock signal frequency. The relative time length of the charge time is also shown in FIG. 8. The BIST FSM 305 (FIG. 3) then releases 520 both counter 310 and counter 335 from the reset state. A sample time then occurs 525, and this sample time is shown in FIG. 8. The Ckout clock signal count is determined 530. If the Ckout clock signal count is acceptably high, then a pass code is saved 535 to indicate a successful lead test mode.

FIG. 6 is a flow diagram illustrating an embodiment of a method for performing a PLL lag test 600 in accordance with the present invention. The test_mode signal (FIG. 3) is set 605 to a value of one by FSM 305 to indicate the PLL lag test 600 will be performed. In step 610, the input signals from FSM 305 to PLL 225 are set up, and the counters 310 and 335 (FIG. 3) are reset by reset signal cnt_reset. A discharge time occurs 615 to charge down the voltage controlled oscillator of the PLL 225 and decrease the Ckout clock signal frequency. The relative time length of the discharge time is also shown in FIG. 9. The BIST FSM 305 (FIG. 3) then releases 620 both counter 310 and counter 335 from the reset state. A sample time then occurs 625, and this sample time is also shown in FIG. 9. The Ckout clock signal count is determined 630. If the Ckout clock signal count is acceptably low, then a pass code is saved 635 to indicate a successful lag test mode.

FIG. 7 is a flow diagram illustrating an embodiment of a method for performing a PLL close loop test 700 in accordance with the present invention. The test_mode signal (FIG. 3) is set 705 to a value of three by FSM 305 to indicate the PLL close loop test 700 will be performed. In step 710, the input signals from FSM 305 are set up, the feedback loop from PLL 225 to FSM 305 is closed, and the counters 310 and 335 (FIG. 3) are reset. A lock time occurs 715 to lock the PLL output clock signal Ckout. The relative time length of the lock time is also shown in FIG. 10. The BIST FSM 305 (FIG. 3) then releases 720 both counter 310 and counter 335 from the reset state. A sample time then occurs 725, and this sample time is also shown in FIG. 10. The Ckout clock signal count is determined 730. If the Ckout clock signal count exceeds a floor frequency value (F3), then the test_mode signal value is set equal to four, and steps 710 to 725 are repeated. It is then determined 740 if the Ckout clock signal is below a ceiling frequency value (F4). If so, then a pass code is saved 735 to indicate a successful close loop test mode.

FIG. 11 is a timing diagram illustrating exemplary testing signals, output clock signals, and signals produced by the testing circuitry of FIG. 3 for a PLL lead test.

The new method dramatically reduces the amount of time the designer usually spends on constructing PLL test vectors. The self time capability makes the vector more reusable and easy for transfer between projects. The programmability of the frequency limitation allows for more testing flexibility during test debugging. The 4 test modes specified by the BIST not only covers all testing goals offered by the traditional PLL test methods, they also provide the capability of testing the close loop configuration.

First of all, this new algorithm uses built-in self testing, instead of manual testing. It includes a hardware BIST circuit 230 that is responsible for setting up the different test stages. It also includes the hardware for automatic measurement of PLL output frequency. In addition, the new algorithm includes registers that can be programmed for different frequency limitation measurement on the fly.

This invention is valuable because it not only minimizes the effort and time from the designer during PLL test vector generation, it also provides more testing flexibility an better measurement on PLL frequency limitation.

What is claimed is:

1. An on-chip built-in self test apparatus for a phase locked loop module that resides on an integrated circuit, receives a reference clock signal and provides an output clock signal, the apparatus comprising:

a finite state machine for (i) receiving the reference clock signal and (ii) producing testing signals for the phase locked loop module; and testing circuitry coupled to the finite state machine for (i) receiving the output clock signal, (ii) determining whether the characteristics of the output clock signal meet a predetermined criteria for open and close loop phase locked loop module operation, and (iii) outputting a test signal that indicates proper phase locked loop module operation if the characteristics of the output clock signal meet the predetermined criteria.

2. The apparatus of claim 1, wherein the testing circuitry comprises:

a first counter for receiving the output clock signal;

a second counter for receiving the reference clock signal;

a register for storing a terminal count value;

a comparator coupled to the second counter and the register for (i) comparing a value of the second counter with the terminal count value and (ii) generating a match signal if the value of the second counter and the terminal count value are equal; and a logic block coupled to the first counter and the comparator for (i) evaluating an arrival time of the match signal and a most significant bit of the first counter and (ii) generating a pass/fail status signal in response to the evaluation of the arrival time of the match signal and the most significant bit of the first counter.

3. The apparatus of claim 2, wherein the testing circuitry further comprises a second register configured to store a plurality of the pass/fail status signals in response to a test mode signal.

4. The apparatus of claim 2, further wherein the testing circuitry further comprises:

a plurality of flip-flops configured to sample the most significant bit of the first counter; and a logic gate configured to pass the most significant bit to the logic block in response to a change in the most significant bit.

5. A method of performing a built-in self test for a phase locked loop module, comprising the steps of:

(A) setting a first counter value based upon a phase locked loop output clock signal;

(B) setting a second counter value based upon a reference clock signal;

(C) generating a match signal in response to the second counter value reaching a terminal count value; and (D) generating a pass/fail status signal based upon (i) an evaluation of an arrival time of the match signal and a most significant bit value of the first counter value and (ii) a particular test mode.

6. The method of claim 5, further comprising the step of storing a plurality of the pass/fail status signals in response to the particular test mode.

7. The method according to claim 5, further comprising the steps of:

sampling the most significant bit value of the first counter value; and passing the most significant bit value in response to a change in the most significant bit value.

8. A method of performing a built-in self test for a phase locked loop module, comprising the steps of:

(A) performing a first test sequence to verify a capability to increase a frequency of a phase locked loop output clock signal relative to a reference clock signal;

(B) performing a second test sequence to verify a capability to decrease the frequency of the phase locked loop output clock signal relative to the reference clock signal; and (C) performing a closed loop test sequence to verify if the phase locked loop output clock signal meets a predetermined criteria for close loop phase locked loop module operation.

9. The method according to claim 8, wherein the steps of the first test sequence comprises the sub-steps of:

waiting a charge time for the frequency to increase; and determine whether the frequency is acceptably high.

10. The method according to claim 8, wherein the steps of the second test sequence comprise the sub-steps of:

waiting a discharge time for the frequency to decrease; and determine whether the frequency is acceptably low.

11. The method of claim 8 wherein the step of performing a closed loop test sequence comprises the sub-steps of:

determining whether the phase locked loop output clock signal exceeds a predetermined floor frequency value; and determining whether the phase locked loop output clock signal is below a predetermined ceiling frequency value.

12. An on chip apparatus connectable to a phase locked loop module, the apparatus comprising:

means for generating a first counter value in response to a clock signal generated by the phase locked loop module;

means for generating a second counter value in response to a reference clock signal receivable by the phase locked loop module;

means for generating a match signal in response to the second counter value reaching a terminal count value; and means for generating a status signal in response to the match signal and a most significant bit value of the first counter value.

* * * * *